(12) United States Patent
Tajima et al.

(10) Patent No.: US 9,450,026 B2
(45) Date of Patent: Sep. 20, 2016

(54) SEMICONDUCTOR DEVICE

(71) Applicant: Kabushiki Kaisha Toshiba, Minato-ku (JP)

(72) Inventors: Hikari Tajima, Koganei (JP); Masaki Kondo, Yokkaichi (JP); Tsukasa Nakai, Yokkaichi (JP); Takashi Izumida, Yokohama (JP); Nobuaki Yasutake, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/465,047

(22) Filed: Aug. 21, 2014

(65) Prior Publication Data

US 2015/0270312 A1 Sep. 24, 2015

Related U.S. Application Data

(60) Provisional application No. 61/969,587, filed on Mar. 24, 2014.

(51) Int. Cl.
| | |
|---|---|
| *H01L 29/788* | (2006.01) |
| *H01L 29/792* | (2006.01) |
| *H01L 27/115* | (2006.01) |
| *H01L 27/24* | (2006.01) |
| *H01L 29/78* | (2006.01) |
| *H01L 27/22* | (2006.01) |
| *H01L 29/10* | (2006.01) |
| *H01L 45/00* | (2006.01) |

(52) U.S. Cl.
CPC ............ *H01L 27/249* (2013.01); *H01L 27/228* (2013.01); *H01L 27/2454* (2013.01); *H01L 29/1041* (2013.01); *H01L 29/7827* (2013.01); *H01L 45/04* (2013.01); *H01L 45/085* (2013.01); *H01L 45/1226* (2013.01); *H01L 45/146* (2013.01); *H01L 45/148* (2013.01)

(58) Field of Classification Search
None
See application file for complete search history.

(56) References Cited

U.S. PATENT DOCUMENTS

| | | | |
|---|---|---|---|
| 7,115,476 B1 | 10/2006 | Izumida | |
| 8,183,628 B2 | 5/2012 | Masuoka et al. | |

(Continued)

FOREIGN PATENT DOCUMENTS

| | | |
|---|---|---|
| JP | 2006-310651 | 11/2006 |
| JP | 2009-38201 | 2/2009 |

(Continued)

OTHER PUBLICATIONS

Office Action issued Feb. 15, 2016 in Taiwanese Patent Application No. 104106098 (with English translation).

*Primary Examiner* — Pamela E Perkins
(74) *Attorney, Agent, or Firm* — Oblon, McClelland, Maier & Neustadt, L.L.P.

(57) ABSTRACT

According to an embodiment, a semiconductor device includes at least two control electrodes, a plurality of semiconductor layers and an insulating film. Each control electrode extends in a first direction. The semiconductor layers are provided between the control electrodes, and arranged in the first direction. Each semiconductor layer extends in a second direction orthogonal to the first direction. The insulating film covers side surfaces of the semiconductor layers, and is disposed between the control electrodes. Each semiconductor layer has a side surface that includes at least one curved surface swelling in a direction from a center of the semiconductor layer to the insulating film.

13 Claims, 7 Drawing Sheets

(56) References Cited

U.S. PATENT DOCUMENTS

| | | |
|---|---|---|
| 8,378,415 B2 * | 2/2013 | Higashino .................... 257/329 |
| 2007/0252201 A1 | 11/2007 | Kito et al. |
| 2009/0230458 A1 * | 9/2009 | Ishiduki et al. ............. 257/324 |
| 2010/0130011 A1 | 5/2010 | Endoh et al. |
| 2012/0147648 A1 * | 6/2012 | Scheuerlein ....... G11C 13/0002 365/51 |
| 2013/0264631 A1 | 10/2013 | Alsmeier et al. |
| 2014/0367762 A1 * | 12/2014 | Tian et al. .................... 257/321 |

FOREIGN PATENT DOCUMENTS

| | | |
|---|---|---|
| JP | 2010-129683 | 6/2010 |
| JP | 5204121 | 6/2013 |

* cited by examiner

SEMICONDUCTOR DEVICE

CROSS-REFERENCE TO RELATED APPLICATION

This application is based upon and claims the benefit of priority from U.S. Provisional Patent Application 61/969,587, filed on Mar. 24, 2014; the entire contents of which are incorporated herein by reference.

FIELD

Embodiments are generally related to a semiconductor device.

BACKGROUND

Semiconductor devices have various structures. For example, a two-dimensionally integrated LSI (Large Scale Integrated circuit), a semiconductor memory device, and the like comprise a transistor which has a horizontal channel directing an electric current flow in a direction parallel to a surface of a semiconductor substrate. In contrast, a three-dimensional device developed for higher integration comprises a vertical transistor which is sometimes used as a selective device.

DETAILED DESCRIPTION

Figure 1:
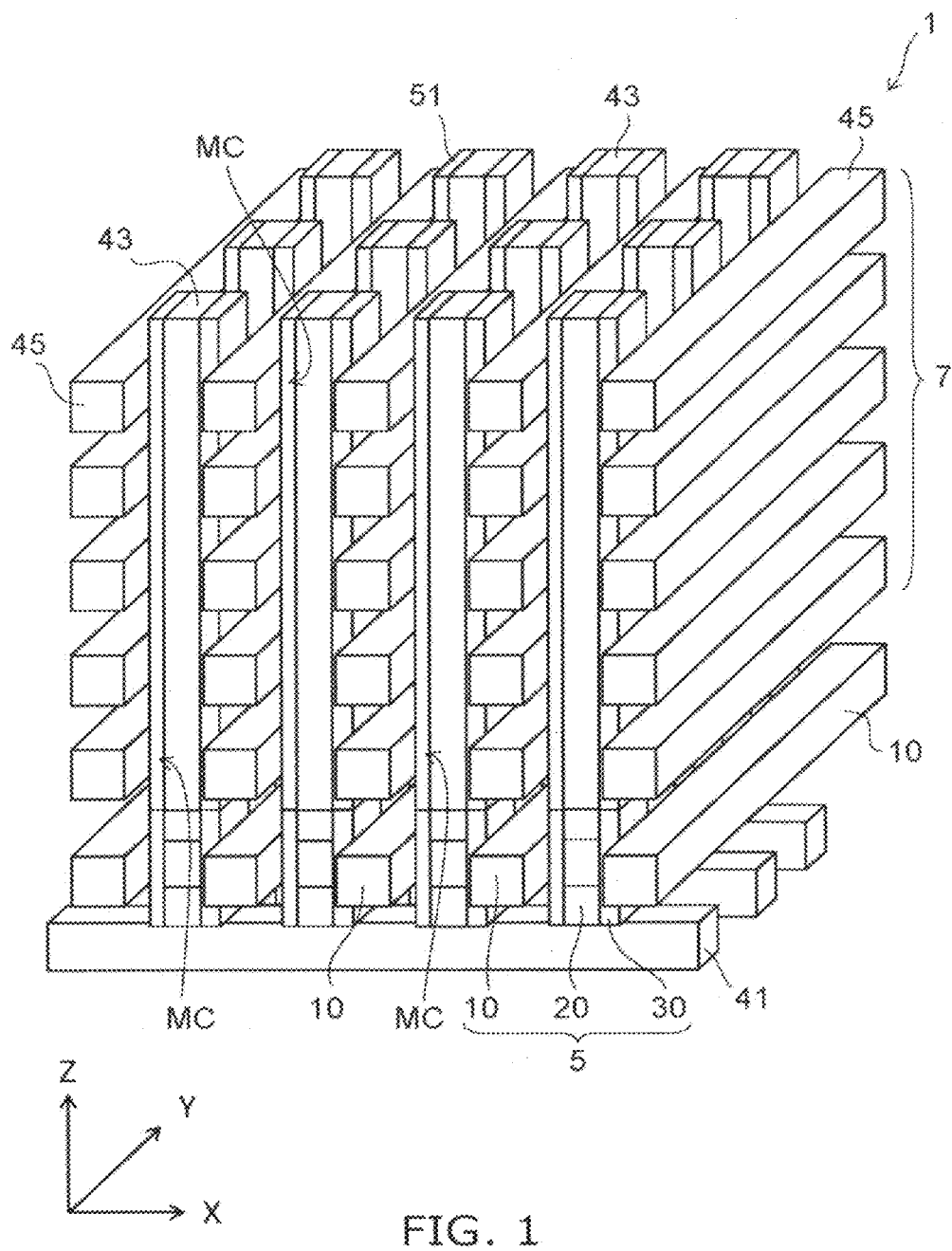
FIG. 1 is a schematic perspective view showing an example of a semiconductor device according to an embodiment.

According to an embodiment, a semiconductor device includes at least two control electrodes, a plurality of semiconductor layers and an insulating film. Each control electrode extends in a first direction. The semiconductor layers are provided between the control electrodes, and arranged in the first direction. Each semiconductor layer extends in a second direction orthogonal to the first direction. The insulating film covers side surfaces of the semiconductor layers, and is disposed between the control electrodes. Each semiconductor layer has a side surface that includes at least one curved surface swelling in a direction from a center of the semiconductor layer to the insulating film.

An embodiment is described below with reference to the drawings. The same components in the drawings are denoted by the same reference numerals and signs and detailed description of the components is omitted as appropriate. Different components are described. The drawings are schematic and conceptual. Relations between thicknesses and widths of components, ratios of sizes among the components, and the like are not always the same as real ones. Even when the same components are shown, dimensions and ratios of the components are shown differently depending on the drawings.

In the embodiment described below, the arrangements of components are described with reference to an X-axis direction, a Y-axis direction, and a Z-axis direction in an orthogonal coordinate system shown in the figures. The Y-axis direction represents a first direction, the Z-axis direction represents a second direction, and the X-axis direction represents a third direction. In the specification, the Z-axis direction is sometimes referred to as upward direction and the opposite direction of the Z-axis direction is sometimes referred to as downward direction.

FIG. 1 is an example of a perspective view schematically showing a semiconductor device 1 according to an embodiment. In FIG. 1, insulating films provided among components are omitted for clearly showing the structure of the semiconductor device 1.

The semiconductor device 1 is, for example, a nonvolatile storage device and includes a transistor array 5 and a memory cell array 7. The transistor array 5 is provided on a base layer (not-shown). As shown in FIG. 1, the memory cell array 7 includes a three-dimensional structure, and is provided on the transistor array 5.

The transistor array 5 includes two control electrodes 10 extending in the Y-axis direction and a plurality of semiconductor layers 20. Each semiconductor layer 20 has a substantially columnar shape. The semiconductor layers 20 are provided between two control electrodes 10. The semiconductor layers 20 are arranged in the Y-axis direction between the two control electrodes. Each semiconductor layer 20 extends in the Z-axis direction.

The transistor array 5 further includes insulating film 30 that fills space between the two control electrodes 10. The insulating film 30 covers side surfaces 20s of the semiconductor layers 20 between the two control electrodes 10 (see FIG. 3A).

As shown in FIG. 1, the transistor array 5 is provided on a plurality of first wires (hereinafter, global bit lines 41). The global bit lines 41 extend in the X-axis direction. The global bit lines 41 are arranged in parallel in the Y-direction. Each semiconductor layer 20 included in the transistor array 5 is provided on any one of the separate global bit lines 41.

The memory cell array 7 includes a plurality of second wires (hereinafter, local bit lines 43) and a plurality of third wires (hereinafter, word lines 45). Each local bit line 43 extends in the Z-axis direction. Each local bit line 43 is connected to any one of the semiconductor layers 20.

On the other hand, the word lines 45 are provided between the local bit lines 43 adjacent to each other in the X-direction. Each word line 43 extends in Y-direction.

Figure 2:
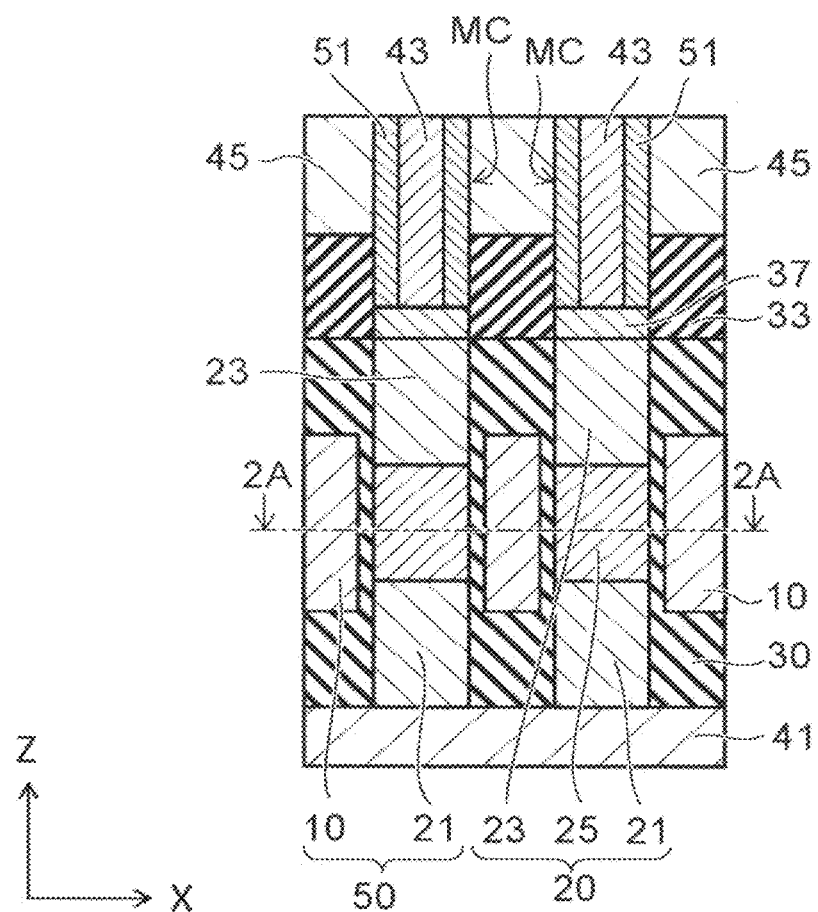
FIG. 2 is a schematic cross-sectional view showing an example of a vertical transistor according to the embodiment.

As shown in FIG. 1, the word lines 45 are stacked in the Z-axis direction via insulating films 33 (see FIG. 2). The memory cell array 7 includes a memory cell MC provided between the local bit line 43 and the word line 45.

For example, memory films 51 are provided along side surfaces of the local bit lines 43 as shown in FIG. 1. Consequently, in cross-portions of the local bit lines 43 and the word lines 45, the memory cells MC are formed, each having a structure in which the wires sandwich the memory films 51. The memory cell array 7 has a three-dimensionally memory cell structure.

The memory films 51 are, for example, resistance change films. The memory films 51 reversibly transition from a first resistance value to a second resistance value with a voltage applied between the local bit line 43 and the word line 45 or an electric current flowing between the local bit line 43 and the word line 45.

The memory films 51 contain, as a main constituent, an oxide containing at least of one element selected from a group of hafnium (Hf), zirconium (Zr), nickel (Ni), tantalum (Ta), tungsten (W), cobalt (Co), aluminum (Al), iron (Fe), manganese (Mn), chrome (Cr), and niobium (Nb). For example, a resistance change material is a thin film containing a material such as $HfO_2$, $Al_2O_3$, $TiO_2$, NiO, $WO_3$, or $Ta_2O_5$. When a predetermined electric current flows through the resistance change material, or a predetermined voltage is applied to the resistance change material, the resistance change material may be reversibly changed in the resistance values.

An ion type film may also be used as the resistance film. For example, one of Si, Ge, SiGe, GaAs, InP, GaP, GaInAsP, GaN, SiC, HfSi, HfO, or AlO may be used as a monocrystal or polycrystal film for the ion type film. A laminated film thereof may be used in the memory films 51. In this case, an electrode of Ag, Au, Ti, Ni, Co, Al, Fe, Cr, Cu, W, Hf, Ta, Pt, Ru, Zr, or Ir or nitride or carbide of the element may be disposed between the local bit lines 43 and the memory films 51, or between the word lines 45 and the memory films 51, for example. Polysilicon containing such materials may also be used for the electrode. A barrier layer of TaSiN may be provided on the memory film 51 on a side opposite to the electrode.

A vertical transistor 50 according to the embodiment is described with reference to FIG. 2. FIG. 2 is a cross-sectional view schematically showing the vertical transistor 50 according to the embodiment. FIG. 2 is an enlarged view of a part of the cross section parallel to an X-Z plane in FIG. 1.

The vertical transistor 50 includes the control electrode 10 and the semiconductor layer 20. The semiconductor layer 20 includes two source-drain portions 21 and 23 arranged in the Z-axis direction and a channel portion 25. The channel portion 25 is provided between the source-drain portions 21 and 23. The control electrode 10 is provided to face the channel portion 25 via the insulating film 30.

The source-drain portion 21 is electrically connected to the global bit line 41. On the other hand, the source-drain portion 23 is electrically connected to the local bit line 43. "Electrically connected" is not limited to the case where an element is directly connected to "an element to be connected", and includes the case where the element is connected thereto via another component.

For example, the source-drain portion 23 is electrically connected to the local bit line 43 via a barrier layer 37 as shown in FIG. 2. The barrier layer 37 may include, for example, a stacked structure of titanium nitride (TiN) and titanium silicide (TiSi). The titanium silicide is in contact with the source-drain portion 23, and reduces contact resistance of the source-drain portion 23. The titanium nitride suppresses diffusion of metal atoms from the local bit line 43 side to the vertical transistor 50 side.

As shown in FIGS. 1 and 2, the vertical transistors 50 are provided on a global bit line 41 extending in the X-axis direction. The vertical transistors 50 control electrical conduction between the global bit line 41 and each local bit line 43.

In this example, a control electrode 10 is provided between two semiconductor layers 20 adjacent to each other among the semiconductor layers 20 disposed on the global bit line 41. That is, the control electrode 10 is shared by two vertical transistors 50 adjacent to each other. For example, one of the vertical transistors 50 can be turned on, when a gate bias is applied to the two control electrodes 10 provided on both sides of one semiconductor layer 20. Consequently, it is possible to electrically connect the global bit line 41 and the local bit line 43 via the vertical transistor 50 that is turned-on. That is, one local bit line 43 is selected from the local bit lines 43 connected to one global bit line 41 via the vertical transistors 50. It is possible to access any one of the memory cells MC provided along the selected local bit line 43.

For example, when data is written in the memory cell MC, the local bit line is selected on which the memory cell MC is provided. An electric current is supplied to the memory film 51 via the vertical transistor 50. Consequently, it is possible to cause the change of resistance value in the memory film 51. It is preferable that an ON current ($I_{ON}$) of the vertical transistor 50 is large enough to supply an electric current sufficient for the resistance-change (i.e. switching the state) in the memory film 51. It is also preferable to suppress an OFF current ($I_{OFF}$) of the vertical transistor 50 so that an electric current flowing to the unselected local bit lines 43 is low enough to prevent various disturbances.

For example, it is preferable for the vertical transistor 50 to use an n-channel transistor that has the large ON current. When polycrystalline silicon (polysilicon) is used as the material for the semiconductor layer 20, the source-drain portions 21 and 23 may be n-type, and the channel portion 25 may be p-type. Note that the source-drain portions 21 and 23 can also be $n^+$-type, and the channel portion 25 may also be $n^-$-type silicon.

Further, in the embodiment, the OFF current of the vertical transistor 50 is suppressed by forming the cross-section of the semiconductor layer 20 (i.e., the cross-section of the channel section 25) in a preferable shape. A relation is described between the cross-sectional shape of the channel portion 25 and the OFF current.

Figure 3A:
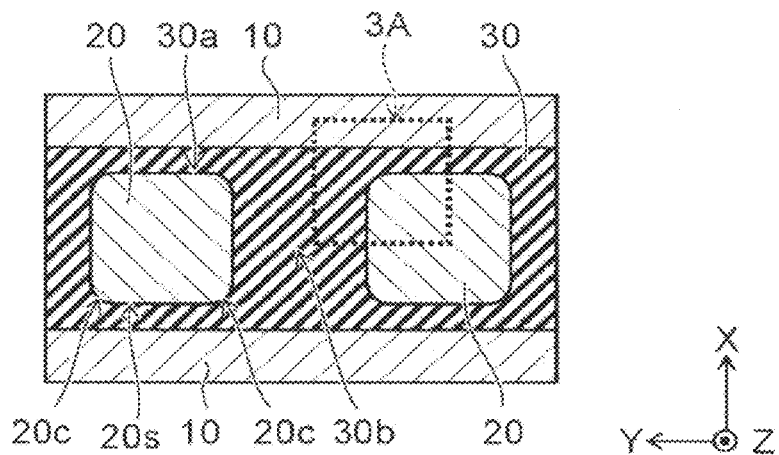
FIG. 3A is a schematic cross-sectional view showing an example of a channel of the vertical transistor according to the embodiment.
Figure 3B:
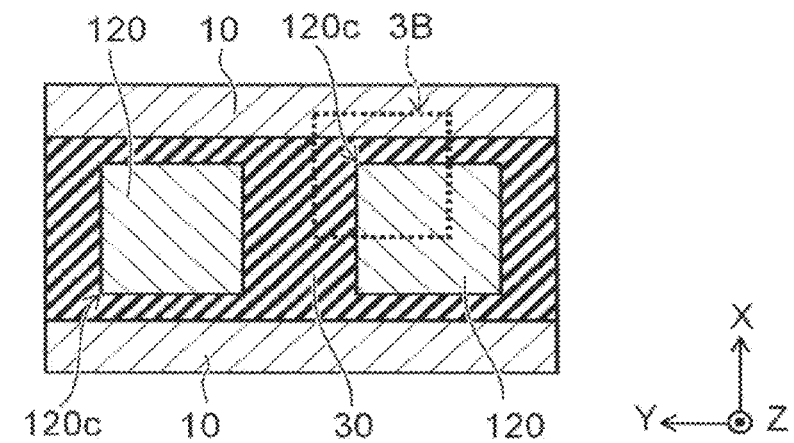
FIG. 3B is a schematic cross-sectional view showing a channel of a vertical transistor according to a comparable example.

FIG. 3A is a cross-sectional view schematically showing an example of a channel part of the vertical transistor 50 according to the embodiment. FIG. 3B is a cross-sectional view schematically showing a channel portion of a vertical transistor according to a comparative example. FIGS. 3A and 3B show a part of a cross-section taken along line 2A-2A shown in FIG. 2.

As shown in FIG. 3A, the semiconductor layers 20 are arranged in the Y-axis direction between the two control electrodes 10. The insulating film 30 is provided in a space between the control electrodes 10 except for a portion occupied by the semiconductor layer 20.

The insulating film 30 includes a first part 30a provided between the semiconductor layer 20 and the control electrode 10, and a second part 30b provided between the two semiconductor layers 20 adjacent to each other in the Y-axis direction. The first part 30a acts as a gate insulating film. The second part 30b electrically insulates the two semiconductor layers 20 from one another. For example, a width of the second part 30b in the Y-axis direction is set larger than a width of the first part 30a in the X-axis direction.

As shown in FIG. 3A, a cross-section of the semiconductor layer 20 parallel to an X-Y plane has a square shape rounded at four corners. That is, the side surface 20s of the semiconductor layer 20 includes curved surfaces 20c swelling to the insulating film 30 side with respect to the center of the semiconductor layer 20. The side surface of the semiconductor layer 20 is formed by a plurality of planes connected to one another by the curved surfaces 20c swelling to the insulating film 30 side. In other words, the semiconductor layer 20 includes, on the side surface thereof, plane parts each facing the control electrode 10, and the curved surfaces 20c located on both sides of the plane parts.

In the vertical transistor according to the comparative example shown in FIG. 3B, channel portion 120 have a cross-section of a square shape having angular corners. The channel portions 120 are arranged in the Y-axis direction between the two control electrodes 10. In a space between the two control electrodes 10, the insulating film 30 is disposed except for parts occupied by the channel portions 120.

Figure 3C:
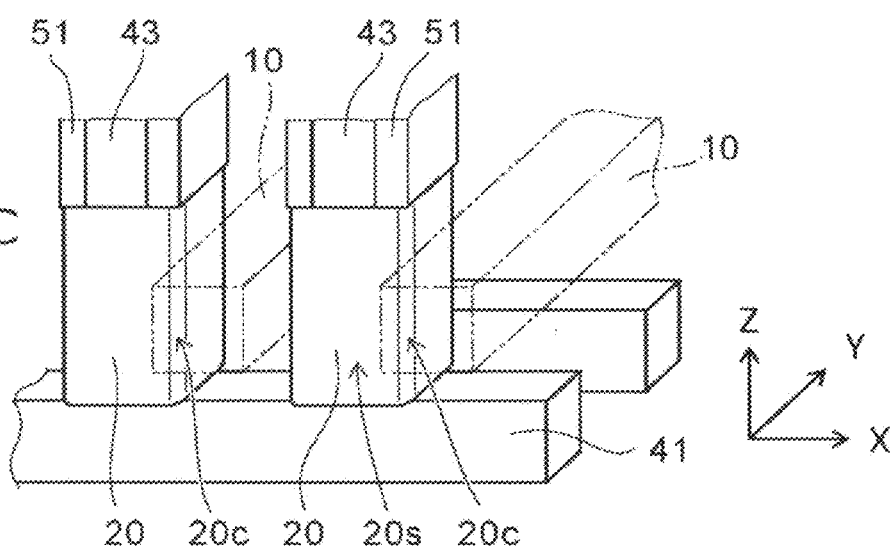
FIG. 3C is a schematic perspective view showing an example of a channel of the vertical transistor according to the embodiment.

FIG. 3C is a perspective view schematically showing an example of the channel portion of the vertical transistor 50 according to the embodiment. The semiconductor layers 20 are provided on the global bit line 41. The side surfaces 20s of the semiconductor layers 20 include the curved surfaces 20c. As shown in FIG. 3C, the curved surfaces 20c continuously extend in the Z-direction between the two control electrodes 10. That is, the curved surfaces 20c are continuously provided in the Z-axis direction between the two control electrodes 10.

Figure 4:
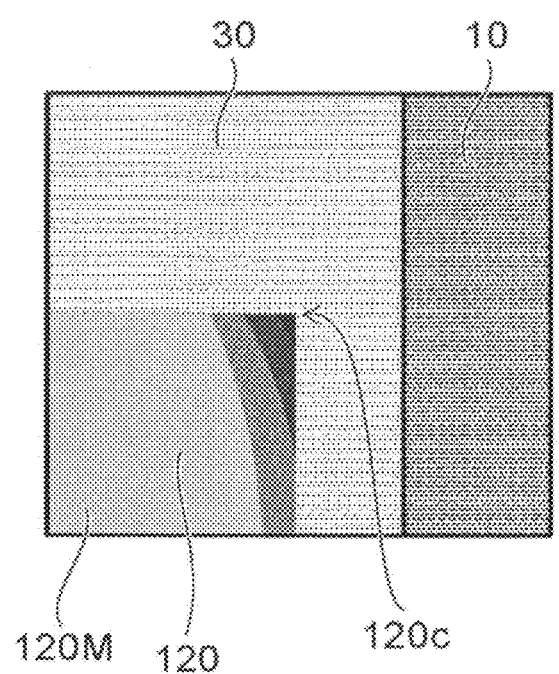
FIG. 4 is a schematic cross-sectional view showing a carrier distribution in the channel of a vertical transistor according to the comparable example.

FIG. 4 is a cross-sectional view schematically showing a carrier distribution in the channel portion 120 of the vertical transistor according to the comparative example. FIG. 4 shows a simulation result of the hole density in a region 3B shown in FIG. 3B.

The channel portion 120 is p-type silicon. The insulating film 30 is a silicon oxide film. The potential of the control electrode 10 is 0 (zero) V. A potential difference between the source-drain portions 21 and 23 is 2.7 V. An impact ionization process is included in the simulation.

In FIG. 4, a dark colored portion in the channel portion 120 indicates a region with higher hole density. A light colored portion in the channel portion 120 indicates a region with lower hole density. For example, in a corner portion 120C of the channel portion 120, hole density is close to $1 \times 10^{18}$ cm$^{-3}$. On the other hand, in a center portion 120M of the channel portion 120, hole density is approximately $5 \times 10^{16}$ cm$^{-3}$. That is, it is found that the impact ionization occurs in the corner portion 120C, and increases the hole density thereof in the square shaped semiconductor layer with the angular corners as shown in FIG. 3B. As a result, the OFF current may flow via the corner portion 120C.

Figure 5A:
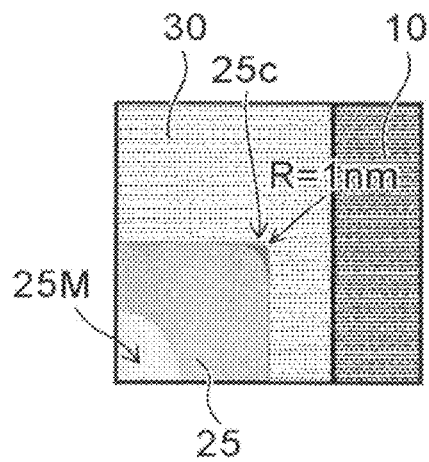
FIGS. 5A to 5C are schematic cross-sectional views showing examples of a carrier distribution in the channel of a vertical transistor according to the embodiment.
Figure 5B:
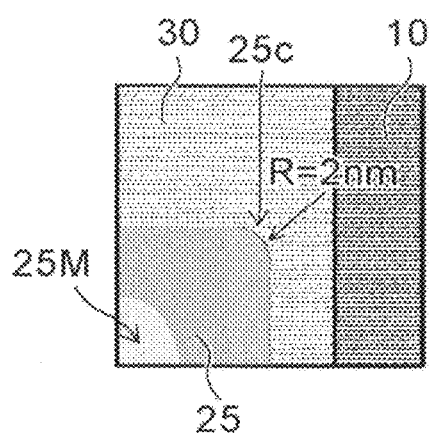
Figure 5C:
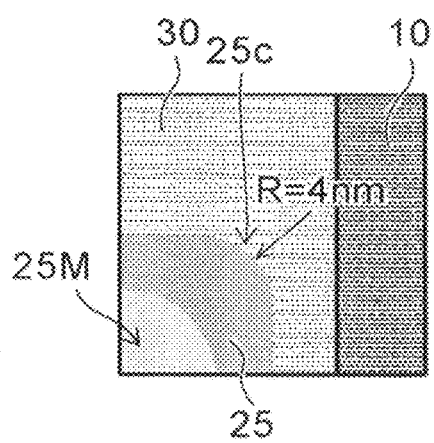

FIGS. 5A to 5C are cross-sectional views schematically showing examples of carrier distributions in the channel portion 25 of the vertical transistor 50 according to the embodiment. FIGS. 5A to 5C show simulation results of hole density in a region 3A shown in FIG. 3A.

In FIG. 5A, a curvature radius R in a corner portion 25C is 1 nanometer (nm). In FIG. 5B, the curvature radius R in the corner portion 25C is 2 nm. The curvature radius R in the corner portion 25C is 4 nm in FIG. 5C. For example, the channel portion 25 is p-type silicon. The insulating film 30 is a silicon oxide film. The potential of the control electrode 10 and the potential difference between the source-drain portions 21 and 23 are the same as those in the example shown in FIG. 4.

In the result shown in FIG. 5A, the hole density in the corner portion 25C is approximately $1 \times 10^{17}$ cm$^{-3}$. In a center portion 25M of the channel portion 25, the hole density is approximately $1 \times 10^{16}$ cm$^{-3}$.

In the result shown in FIG. 5B, the hole density in the corner portion 25C is approximately $8 \times 10^{16}$ cm$^{-3}$. In the center portion 25M of the channel portion 25, the hole density is approximately $1 \times 10^{16}$ cm$^{-3}$.

In the result shown in FIG. 5C, the hole density in the corner portion 25C is approximately $5 \times 10^{16}$ cm$^{-3}$. A region in which the hole density is approximately $1 \times 10^{16}$ cm$^{-3}$ becomes larger in the center portion 25M of the channel portion 25.

In this way, the hole density in the corner portion 25C decreases as the curvature radius R is increased. That is, it is preferable in the vertical transistor 50 to reduce the curvature radius R for suppressing the OFF current. According to the simulation results in FIGS. 5A to 5C, the curvature radius R of the corner portion 25C is favorably set to 1 nm or more, for example. Consequently, it is possible to reduce the hole density in the channel portion 25 to $1 \times 10^{17}$ cm$^{-3}$ or less. Thus, it is possible to reduce the OFF current. It is more preferable to set the curvature radius R of the corner portion 25C to 2 nm or more.

Figure 6A:
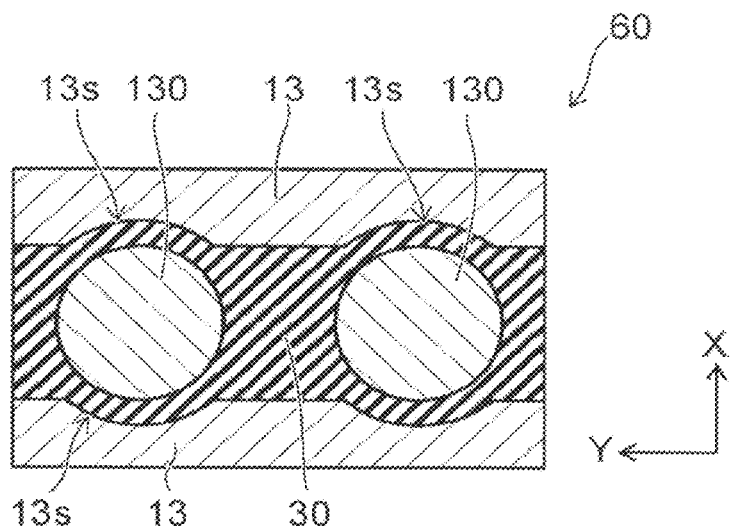
FIGS. 6A to 6C are schematic cross-sectional views showing examples of a channel in a vertical transistor according to variations of the embodiment.
Figure 6B:
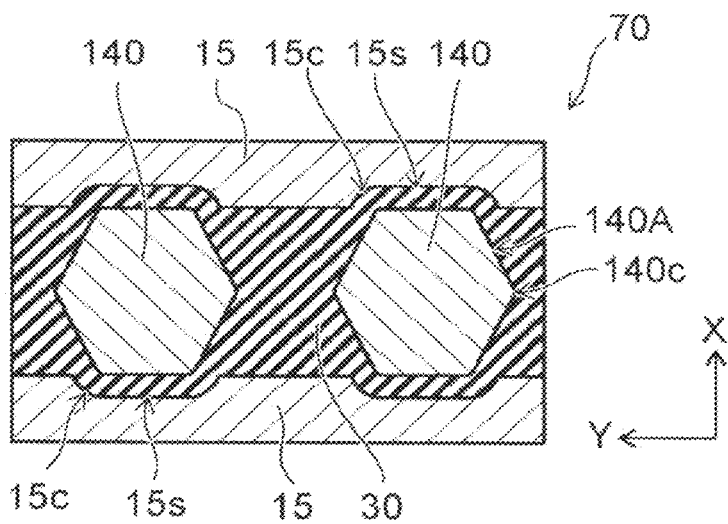
Figure 6C:
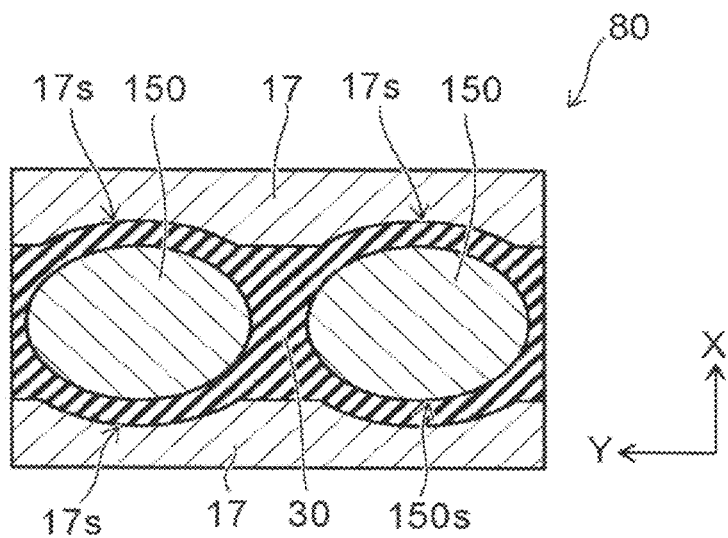

FIGS. 6A and 6C are cross-sectional views schematically showing examples of channel portions of vertical transistors 60 and 70 according to a variation of the embodiment. FIGS. 6A and 6C show a part of the cross-section taken alone line 2A-2A shown in FIG. 2.

In the vertical transistor 60 shown in FIG. 6A, a cross-section of channel portion 130 has a substantial circular shape. The channel portions 130 are arranged in the Y-axis direction between two control electrodes 13. In a space between the two control electrodes 13, the insulating film 30 is provided except for parts occupied by the channel portions 130. In this example, the entire side surfaces of the channel portions 130 are curved surfaces. It is possible to suppress impact ionization and reduce an OFF current.

Further, the control electrode 13 includes concave that having curved surfaces on side surfaces 13s facing the channel portions 130 such that interval between the control electrode 13 and the channel portions 130 is constant along the concave. Consequently, it is possible in the channel portions 130 to increase a channel width along the vicinity of interfaces between the channel portions 130 and the insulating film 30. Thus, it is possible in the vertical transistor 60 to reduce an OFF current, and increase the ON current.

In the vertical transistor 70 in FIG. 6B, a cross-section of channel portion 140 has a substantial hexagonal shape. The channel portions 140 are arranged in the Y-axis direction between two control electrodes 13. In a space between the two control electrodes 15, the insulating film 30 is provided except for parts occupied by the channel portions 140.

In this example, six corner portions 140C of the channel portion 140 are provided to protrude in a direction toward the insulating film 30 from the center of the channel portion 140. The corner portions 140 connect six plane portions 140A. Thus, it is possible to suppress impact ionization in the corner portions 140C and reduce an OFF current. Note that the corner portions 140C can be rounded as shown in FIG. 3A. Then, it becomes possible to further reduce the OFF current.

Further, the control electrode 15 includes concave portions on side surfaces 15s facing the channel portions 140. The side surfaces 15s are provided such that interval between the control electrode 15 and the channel portion 140 is constant along the concave portion. The control electrode 15 includes surfaces curved at both ends of the concave portions. Then, it is possible to increase a channel width along interfaces between the channel portion 140 and the insulating film 30. As a result, it is possible in the vertical transistor 70 to reduce an OFF current and increase an ON current.

In the vertical transistor 80 in FIG. 6C, a cross-section of channel portions 150 has an ellipsoidal shape. The channel portions 150 are arranged in the Y-axis direction between two control electrodes 17. In a space between the two control electrodes 13, the insulating film 30 is provided except for parts occupied by the channel portions 150. In this example, the entire side surfaces of the channel portions 150 are curved surfaces. It is possible to suppress impact ionization and reduce an OFF current.

The control electrode 17 includes concave surfaces curved on side surfaces 17s facing the channel portions 150. The concave surfaces are provided such that interval between the control electrode 17 and the channel portion 150 is constant along the concave surface. Thus, it is possible to increase a channel width along interfaces between the channel portion 150 and the insulating film 30. Then, it becomes possible in the vertical transistor 60 to reduce an OFF current and increase the ON current.

In this way, the semiconductor layer 20 (in other words, the channel portion 25) may be a circle or a polygon having four or more sides in the cross-section orthogonal to the Z-axis direction. The embodiment is not limited to the examples described above. The cross-section of the semiconductor layer 20 may have an appropriate shape. It may have a shape having a plurality of plane side surfaces connected by convex with curved surfaces.

Figure 7:
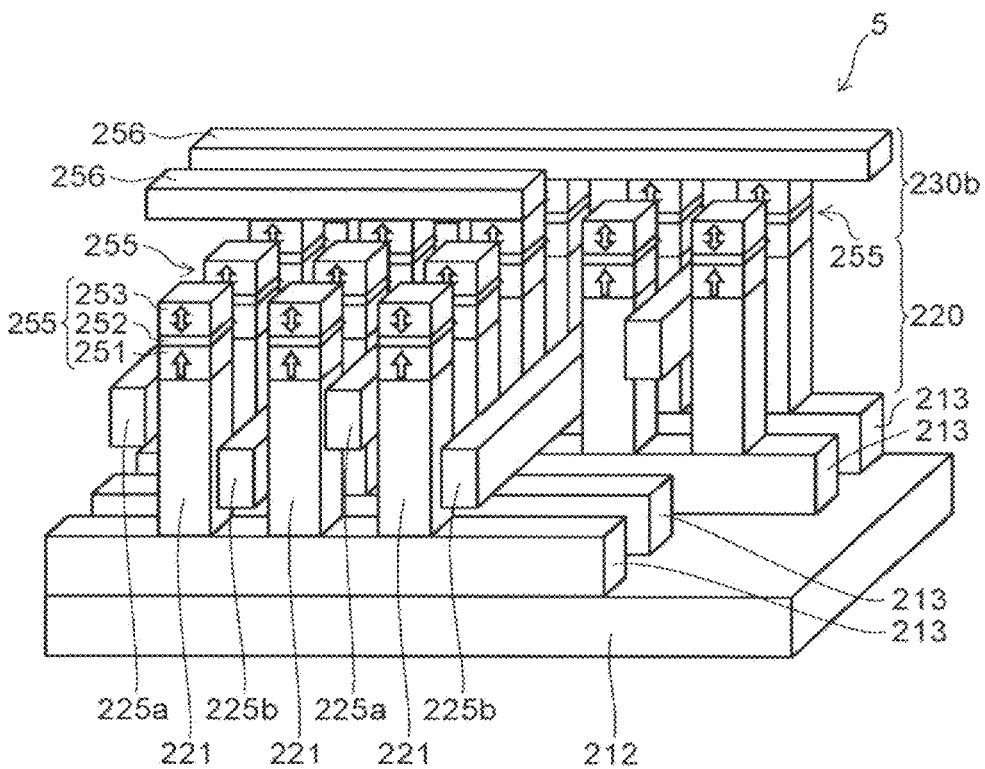
FIG. 7 is a schematic perspective view showing an example of other device using the vertical transistor according to the embodiment.

The vertical transistor 50 according to the embodiment may also be applied to, for example, an integrated circuit device 5 shown in FIG. 7. The integrated circuit device 5 is, for example, an MRAM (Magneto resistive Random Access Memory).

As shown in FIG. 7, in the integrated circuit device 5, a plurality of local source lines 213 are provided on an upper portion of a monocrystal silicon substrate 212. The local source lines 213 are periodically arrayed in the Y-direction. Each local source line 213 extends in the X-direction. The local source lines 213 are electrically separated from each other by STI (Shallow Trench Isolation), an embedded insulating film, or an impurity concentration difference, for example. Alternatively, the local source lines 213 may be bound to one line. A wire selecting portion 220 may be provided on a wiring layer including the local source lines 213, as described in the first embodiment. In the embodiment, for example, the wire selecting portion 220 has a channel that is directly formed on the silicon substrate 12 by etching. Then, the channel is made of monocrystal silicon. Compared with a channel made of polysilicon, it is possible to increase an ON current.

The integrated circuit device 5 comprises a memory portion 230b provided on the wire selecting portion 220. In the memory portion 230b, MTJ (Magnetic Tunnel Junction) element 255 is provided on each semiconductor member 221 as memory element. The MTJ element 255 is a kind of a magnetic resistance element. The MTJ element 255 includes a fixed layers 251 connected to the semiconductor members 221, an insulating layer 252 and a memory layers 253, which are stacked in this order from the lower side. The fixed layer 251 is a vertical magnetization film that has a fixed magnetization direction. The storage layer 253 is also a vertical magnetization film that has a movable magnetization direction. A local bit line 256 extending in the X-direction is provided on the MTJ devices 255. The local bit line 256 is disposed over regions directly above the local source lines 213. The local bit line 256 is connected in common to the memory layers 253 of the MTJ devices 255 arrayed in line along the X-direction.

A configuration, a manufacturing method, and operations of the device other than those described above in the embodiment are the same as those in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first semiconductor layer;
   at least two control electrodes each extending in a first direction the first semiconductor layer being provided between the at least two control electrodes and extending in a second direction crossing the first direction, the first semiconductor layer being disposed between the at least two control electrodes in a third direction, the third direction crossing a plane that includes the first direction and the second direction;
   an insulating film disposed between the at least two control electrodes in the third direction and covering a side surface of the first semiconductor layer, the side surface of the first semiconductor layer including at least one curved surface swelling in a direction from a center of the first semiconductor layer to the insulating film;
   a first wiring extending in the third direction, the first semiconductor layer being provided on the first wiring and electrically connected to the first wiring;
   a second wiring provided on the first semiconductor layer and extending in the second direction, the second wiring electrically connected to the first semiconductor layer; and
   a second semiconductor layer provided between the at least two control electrodes and arranged in the first direction with the first semiconductor layer,
   wherein the insulating film includes a first portion provided between the first semiconductor layer and each of the at least two control electrodes, and a second portion provided between the first semiconductor layer and the second semiconductor layer.

2. The device according to claim 1, wherein the side surface of the first semiconductor layer includes plane portions each facing any one of the at least two control electrodes, and curved surfaces located on both sides of each plane portion in the first direction.

3. The device according to claim 1, wherein the first semiconductor layer has a shape of a circle, an ellipse, or a polygon having four or more sides in a cross-section orthogonal to the second direction.

4. The device according to claim 1, wherein the curved surface continuously extends in the second direction.

5. The device according to claim 1, wherein the curved surface has a curvature radius not less than 1 nanometer.

6. The device according to claim 1, wherein each of the at least two control electrodes includes a concave surface, and an interval is constant along the concave surface between each control electrode of the at least two control electrodes and the first semiconductor layer facing thereto.

7. The device according to claim 1, wherein the second portion has a width in the first direction larger than a width of the first portion in the third direction.

8. The device according to claim 1, wherein
the first semiconductor layer includes a first diffusion portion, a second diffusion portion, and a channel portion provided between the first diffusion portion and the second diffusion portion, wherein
the first diffusion portion is provided between the first wiring and the channel portion;
the second diffusion portion is provided between the second wiring and the channel portion, and
the channel portion faces the at least two control electrodes via the insulating film.

9. The device according to claim 8, wherein each of the first diffusion portion and the second diffusion portion has n-type conductivity.

10. The device according to claim 1, further comprising:
a third wiring adjacent to the second wiring, the third wiring extending in the first direction; and
a memory cell provided at an intersecting portion of the second wiring and the third wiring.

11. The device according to claim 10, wherein the memory cell includes a resistance change film provided between the second wiring and the third wiring, which reversibly transitions from a first resistance value to a second resistance value, when applying a voltage thereto, or flowing an electric current therethrough.

12. The device according to claim 8, further comprising:
a third wiring adjacent to the second wiring, the third wiring extending in the first direction; and
a memory cell provided at an intersecting portion of the second wiring and the third wiring.

13. The device according to claim 12, wherein the memory cell includes a resistance change film provided between the second wiring and the third wiring, which reversibly transitions from a first resistance value to a second resistance value, when applying a voltage thereto, or flowing an electric current therethrough.

* * * * *